United States Patent

Apelgren et al.

[11] Patent Number: 5,848,382
[45] Date of Patent: Dec. 8, 1998

[54] METHOD FOR AUTOMATED ENERGY DOSE MEASUREMENT AND ADJUSTMENT FOR A PHOTOALIGNER

[75] Inventors: Eric M. Apelgren; Gerald W. Barnett, both of Austin, Tex.

[73] Assignee: Advanced Micro Devices, Inc.

[21] Appl. No.: 884,522

[22] Filed: Jun. 27, 1997

[51] Int. Cl.$^6$ ................................................. G01C 25/00
[52] U.S. Cl. ................................. 702/85; 702/94; 702/95
[58] Field of Search ......................... 364/571.01, 571.02, 364/571.04, 571.05, 571.08, 551.06, 561; 702/85, 86, 88, 94, 95, 150

[56] References Cited

U.S. PATENT DOCUMENTS

| | | | |
|---|---|---|---|
| 4,498,140 | 2/1985 | Hall | 364/571.04 |
| 4,593,371 | 6/1986 | Grajewski | 364/571.01 |
| 5,021,979 | 6/1991 | Rice | 364/525 |
| 5,444,637 | 8/1995 | Smesry et al. | 364/556 |

OTHER PUBLICATIONS

Dally et al., Instrumentation for Engineering Measurements, John Wiley & Sons, Inc Pub., pp. 14, 15 & 19, Dec. 1993.

*Primary Examiner*—John Barlow
*Assistant Examiner*—Craig Steven Miller
*Attorney, Agent, or Firm*—Kevin L. Daffer; Conley, Rose & Tayon

[57] ABSTRACT

A Visual Basic software program to automate the procedures required for energy dose verification and adjustment of the ASM photoaligner. The software program has the capability of manipulating the ASM photoaligner through a resident software routine of the photoaligner. In addition, the software program has a user interface which prompts the operator for inputs and instructs the operator on what is required to perform the energy dose calibration. This ensures a reproducible procedure regardless of the photoaligner being tested or the operator doing the testing. Automating this procedure allows changing the photoaligner energy dose through the ASM Machine Constants (values stored in the ASM photoaligner that control the operation of the photoaligner). If the input data is out of specification the program will either reference a trouble shooting guide or request that the specific procedure be repeated for verification. After collecting the data from the operator, the program makes the necessary calculations and compares the results to a predefined data base which contains the specification limits for each of the individual photoaligners. Besides saving time, automating these procedures ensures that all operators perform them the same way, thereby eliminating operator-to-operator variation. Furthermore, it will no longer be necessary to open the ASM electronics cabinet to adjust the shutter control board potentiometer for brining the dose back to specification and by making the changes through software it will be possible to track them over time.

14 Claims, 5 Drawing Sheets

```
┌─────────────────────────────────────────────────────────────────┐
│ -                      Maintenance                      ▽  △    │
│  ┌──────────┐ ┌──────────────────┐ ┌─────────────────┐ ┌──────┐ │
│  │Dose Check│ │Before Lamp Change│ │After Lamp Change│ │Cancel│ │
│  └──────────┘ └──────────────────┘ └─────────────────┘ └──────┘ │
│  ┌─Spec Limits──────────────────────────────────────────────┐   │
│  │ ┌─Slope──────────┐ ┌─ECF───────────┐ ┌─200 mj exposure─┐ │   │
│  │ │Min       0.96  │ │Min      0.135 │ │Min        192   │ │   │
│  │ │Target    0.975 │ │Max      0.155 │ │Target     195   │ │   │
│  │ │Max       1.03  │ └───────────────┘ │Max        206   │ │   │
│  │ └────────────────┘                   └─────────────────┘ │   │
│  └──────────────────────────────────────────────────────────┘   │
│  ┌─Data Entry Limits────────────────────────────┐ ┌─Tool─────┐  │
│  │ ┌─Intensity─┐ ┌─100 mj exposure─┐ ┌─300 mj exposure─┐ │ │ASML13│  │
│  │ │Min   300  │ │Min   85         │ │Min   285        │ │ └──────┘  │
│  │ │Max   500  │ │Max   115        │ │Max   315        │ │          │
│  │ └───────────┘ └─────────────────┘ └─────────────────┘ │          │
│  └──────────────────────────────────────────────┘                │
└─────────────────────────────────────────────────────────────────┘
```

FIG. 9

```
┌──────────────────────────────────────────────────────────────────────────┐
│ -                           Dose Check                            ▽  △   │
│ ┌──────┐ ┌──────┐ ┌──────┐ ┌────────────┐┌──────────────┐┌──────────┐    │
│ │START │ │ Next │ │Repeat│ │Lamp Lit time││test start time││Technician│    │
│ └──────┘ └──────┘ └──────┘ └────────────┘└──────────────┘└──────────┘    │
│ ┌──────────────────────────────────────────────────────────────────────┐ │
│ │Press START to start the test                                         │ │
│ │                                                                      │ │
│ └──────────────────────────────────────────────────────────────────────┘ │
│ ┌─────────┬──────────────┬──────────────┬──────────┬──────────┬────────┐ │
│ │Intensity│Energy measured│Energy measured│Calculated│Calculated│Current │ │
│ │         │for 100 mJ dose│for 300 mJ pulse│  slope  │energy at │  ECF   │ │
│ │         │              │              │          │ 200 mJ   │        │ │
│ ├─────────┼──────────────┼──────────────┼──────────┼──────────┼────────┤ │
│ │         │              │              │          │          │        │ │
│ └─────────┴──────────────┴──────────────┴──────────┴──────────┴────────┘ │
└──────────────────────────────────────────────────────────────────────────┘
```

FIG. 10

METHOD FOR AUTOMATED ENERGY DOSE MEASUREMENT AND ADJUSTMENT FOR A PHOTOALIGNER

BACKGROUND OF THE INVENTION

1. Field of the Invention

This invention relates to the field of semiconductor processing and, more particularly, to a software program for measuring and adjusting the energy dose of a photoaligner.

2. Description of Relevant Art

Fabrication of a metal-oxide-semiconductor ("MOS") transistor is well-known. Fabrication typically begins by introducing n-type or p-type impurities into a single-crystal silicon substrate. The active regions of the substrate (where the transistors will be formed) are then isolated from each other using isolation structures. In modern fabrication technologies, the isolation structures may comprise shallow trenches in the substrate filled with a dielectric such as oxide which acts as an insulator. Isolation structures may alternatively comprise, for example, locally oxidized silicon ("LOCOS") structures. A gate dielectric is then formed by oxidizing the silicon substrate. Oxidation is generally performed in a thermal oxidation furnace or, alternatively, in a rapidthermal-anneal ("RTA") apparatus. A gate conductor is then patterned using a photolithography/etch process from a layer of polycrystalline silicon ("polysilicon") deposited upon the gate dielectric. The photolithography process allows selective removal of a photoresist film deposited entirely across the polysilicon. The portion of the photoresist film that is exposed can, according to one embodiment, be polymerized, and that which is not exposed removed during the "develop" stage of the lithography process. The regions that are non-polymerized form a mask for a subsequent etch during which portions of the polysilicon layer that are not masked by the photoresist pattern are removed. After the etch process, the patterned photoresist layer is stripped away.

The polysilicon is typically rendered conductive with the introduction of ions from an implanter or a diffusion furnace. Subsequently, source and drain regions are doped with a high-dose n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When an appropriate bias is applied to the gate of an enhancement-mode transistor, a conductive channel between the source and drain is induced and the transistor turns on.

The patterns that define the microcircuits are created by photolithographic processes. Layers of photoresist are first deposited onto the wafer substrate. Next, the photoresist layer is selectively exposed to a form of radiation such as ultraviolet light, electrons, or x-rays. An exposure tool and mask, or data tape in electron beam lithography, are used to effect the desired selective exposure. The patterns in the resist are formed when the photoresist undergoes the subsequent development step. The areas of resist remaining after development protect the regions that they cover. Locations from which resist has been removed can be subjected to a variety of additive (e.g. depositions) or subtractive (e.g. etching) processes that transfer the pattern onto the substrate surface.

FIGS. 1–5 show the basic steps for a photolithographic process. Semiconductor substrate 10 is provided. Layer 20 (which may be, for example, oxide, polysilicon, etc.) is the layer to be patterned. Photoresist 30 is applied as a thin film to cover layer 20, and subsequently exposed to radiation 50 through mask 40 (or a reticle in step-and-repeat projection systems). Mask 40 contains clear and opaque features that define the pattern to be created in photoresist layer 30. The areas in the photoresist exposed to the light are made either soluble or insoluble in a specific solvent known as developer. In the case when the exposed regions are soluble (which is the case shown), a positive mask is produced in the photoresist as shown in FIG. 2. The photoresist is then termed positive photoresist. If the non-exposed regions are dissolved by the developer, a negative image results. Hence, the photoresist is termed a negative photoresist. Following development, the regions of layer 20 no longer covered by photoresist 30 are removed by etching, thereby replicating the mask pattern onto layer 20 as shown in FIG. 3. The remainder of photoresist 30 may then be removed by some form of polishing. The end result is shown in FIG. 4.

In semiconductor circuit fabrication, the resolution of the optical lithography printing system is of major importance. The optical resolution is the main limitation of minimum device size. Resolution in optical lithography systems is limited by diffraction effects, which spread radiation from the illumination source into regions of the photoresist which are not directly exposed. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the $2d=0.61\lambda/NA$. Where 2d is the separation distance of two images, $\lambda$ is the wavelength of the energy source, and NA is the numerical aperture of the lens.

The equipment used to optically transfer patterns to wafers is generally referred to as an optical aligner, printer, or exposure tool. Such machines contain a variety of subsystems that work together to perform the imaging function, including: a) an illumination source that provides radiation to chemically alter the photoresist; b) an optical subsystem that focuses the circuit patterns onto the wafer; c) a movable stage that holds the wafer to be exposed. The stage position can be finely and accurately adjusted so that the image from the optical pattern transfer tool (i.e., the reticle or the mask) can be aligned to previously printed patterns on the wafer, a very critical step.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~436 nm is designated the "G-line," the ~405 nm peak the "H-line, " and the ~370 nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

The total energy transferred to the wafer from an optical aligner is a product of the intensity of the light used and the exposure time. Intensity is measured in $mW/cm^2$, energy in mJ/cm$^2$, and time in s. The total energy dose transferred to the photoresist is critical in transferring the mask pattern onto the photoresist layer. An underexposed positive photoresist layer will yield a pattern with thicker critical dimensions compared to the mask pattern. An overexposed photoresist will yield a pattern with thinner critical dimensions. It is therefore critical to be able to accurately control the total amount of energy dose that a photoresist is exposed to. Most photoaligners accomplish this by controlling the exposure time. The intensity of the radiation remains approximately constant during a run of the equipment. However, after longer periods of time, the intensity of the radiation drops and the photoaligner must be calibrated to ensure that the energy dose remains the same.

Such a photoaligner is the ASM photoaligner. The energy dose on an ASM photoaligner is controlled by a shutter control system. The energy of the light, in mJ/cm$^2$, which is transmitted to the wafer is equivalent to the intensity of the light, in mW/cm$^2$, times the exposure time, in sec (E=It). The intensity of the light is measured by an energy meter which is mounted between the condenser lens and the reticle masking system. A circuit on the shutter control card integrates the light intensity signal to obtain a measure of light energy. The exposure time is not fixed, but depends on the intensity of the light reaching the wafer (via the projection system). This ensures that the extent to which the wafer is exposed is independent of light intensity.

The shutter on the ASM photoaligner is a blade which covers an opening that the light passes through. An important feature of this system is that during an exposure, the shutter rotates through 360°. This ensures that those parts of the image field that are exposed first as the shutter opens are also cut-off from the illumination beam first as the shutter closes. Thus, the exposure period is the same for all parts of the image field.

The servo motor drives the shutter blade and an incremental encoder. The encoder generates pulses as the motor rotates. A decoder on the shutter control board translates the encoder output signals into count pulses and a direction signal. A frequency to voltage converter translates the time between two count pulses into an analog speed signal. The gain of this signal can be manually adjusted by a variable resistor on the shutter control board ($R_{scb}$) or with the energy conversion factor (ECF). The energy conversion factor is one of the machine constants which can be set using the photoaligners resident software (nominal value is 0.14648 cm$^2$/mJ). The ECF can also be thought of as a resistor ($R_{ecf}$).

These two resistors are utilized in an inverting operational amplifier configuration to determine the gain as illustrated in FIG. 5. $E_{set}$ is the energy dose value which is requested or targeted (using the resident software of the photoaligner) and Emeas is the output of the photoaligner that is measured with an energy dose meter (usually by an operator). The gain is essentially a multiplication factor which is applied to the value of $E_{set}$. Accordingly, as the value of $E_{set}$ increases, the difference between $E_{set}$ and $E_{meas}$ also increases. The gain is the slope of the graph of $E_{meas}$ vs. $E_{set}$ as shown in FIG. 6.

If $E_{meas}$ does not equal the target energy dose, it is possible to adjust the photoaligner's settings by holding $R_{scb}$ constant and adjusting $R_{eef}$ or vice versa. The equation for determining the new $R_{scb}$ is $$R_{scb/new} = R_{scb/current} \times \frac{E_{set}}{E_{meas}}.$$

Similarly, the equation for determining the new $R_{eef}$ is $$R_{ecf/new} = R_{ecf/current} \times \frac{E_{meas}}{E_{set}}.$$

The relationship between $R_{scb}$, $R_{eef}$, and the slope is illustrated in FIG. 7.

Calibration of the photoaligner is regularly performed by operators. The operator first removes the reticle from the photoaligner and then places an energy meter in the path of the radiation. Using the Command Handler, the resident software of the ASM photoaligner, the operator selects the desired energy output for the photoaligner which sets the value of $E_{set}$. The photoaligner is then activated and the actual energy output, $E_{meas}$ is measured using the energy meter. To compensate for any difference between the set value $E_{set}$ for the energy dose and the measured value $E_{meas}$, the operator makes the appropriate adjustment to the resistance $R_{scb}$. The adjustment is performed manually by turning a variable resistor on the photoaligner.

The above method requires operators to be well trained in the calibration procedures. The operators have to not only perform the appropriate measurements but also make the appropriate calibration adjustments. The calibration adjustments have to be performed manually with the additional risk of interfering with other parts of the photoaligner. In addition it is difficult to keep a log of all calibrations performed by each of the operators for each of the photoaligners. It would thus be desirable to have a more reliable method of calibrating the photoaligner which additionally keeps a log of all the calibration steps performed on every aligner.

SUMMARY OF THE INVENTION

A Visual Basic software program was written to automate the procedures required for energy dose verification and adjustment of the ASM photoaligners. The software program has the capability of manipulating the ASM photoaligner through a resident software routine of the photoaligner. In addition, the software program has a user interface which prompts the operator for inputs and instructs the operator on what is required to perform the energy dose calibration. This ensures a reproducible procedure regardless of the photoaligner being tested or the operator doing the testing. In addition, automating this procedure allows changing the photoaligner energy dose through the ASM Machine Constants (values stored in the ASM photoaligner that control the operation of the photoaligner). The alternative, which is changing the energy dose of the photoaligner by adjusting a variable resistor on the shutter control board, requires minor "tweaks" to reach the desired energy dose. Making the changes through software allows for precise adjustment to the desired set point for the energy dose.

If the input data is out of specification the program will either reference a trouble shooting guide or request that the specific procedure be repeated for verification. After collecting the data from the operator, the program makes the necessary calculations and compares the results to a predefined data base which contains the specification limits for each of the individual photoaligners. If the results are out of specification limits, the program will make the necessary adjustments to the Machine Constants to bring the energy dose value back within the specification limits.

Besides saving time, automating these procedures ensures that all operators perform them the same way, thereby eliminating operator to operator variation. Furthermore, it will no longer be necessary to open the ASM electronics cabinet to adjust the shutter control board potentiometer for bringing the dose back to specification and by making the changes through software it will be possible to track them over time.

Note, one difference between the new procedures and the old procedures is that the new ones require dose measurements at two set points (100 mJ and 300 mJ) instead of just at one set point (200 mJ). The advantage of this is that, with one set point, only one piece of information can be obtained, that being the measurement, while with two set points four pieces of information can be obtained, that being the two measurements and the slope and intercept. These additional pieces of information provide additional parameters to check against if there is a problem.

Broadly speaking, the present invention contemplates a computer storage medium configured with computer instructions for controlling a photoaligner. The photoaligner is first set at a set operating state by invoking a resident software routine. An operator is then prompted to perform a task and enter an externally observed value which reflects an observed operating state of the photoaligner. A control parameter of the photoaligner is adjusted in order to compensate for a difference between the set operating state and the externally observed operating state of the photoaligner. The set operating state, the externally observed value, the observed operating state, and the control parameter are logged.

The computer storage medium may further comprise, after prompting an operator to perform a task, computer instructions for setting the photoaligner. The photoaligner is set at a second set operating state by invoking the resident software routine of the photoaligner. An operator is prompted to perform the task and enter a second externally observed value that reflects a second observed operating state of the photoaligner. A desired setting for said control parameter is computed by interpolating between the externally observed value and the second externally observed value. The photoaligner may be set, for example, to operate at a given energy dose value and the externally observed value may be an externally observed energy dose.

The step of prompting an operator to perform a task comprises first placing an energy dose meter into the photoaligner such that said energy dose meter is exposed to a radiation of the photoaligner. The energy dose of the photoaligner is then measured with the energy dose meter and entered into the storage medium. The energy dose is a product of an intensity of the radiation and an exposure time.

BRIEF DESCRIPTION OF THE DRAWINGS

Other objects and advantages of the invention will become apparent upon reading the following detailed description and upon reference to the accompanying drawings in which:

FIG. 9 shows a screen snap-shot from the Visual Basic program written to direct operators and control the photoaligner through the calibration process; and FIG. 10 shows a second screen snap-shot from the Visual Basic program written to direct operators and control the photoaligner through the calibration process.

Figure 1:
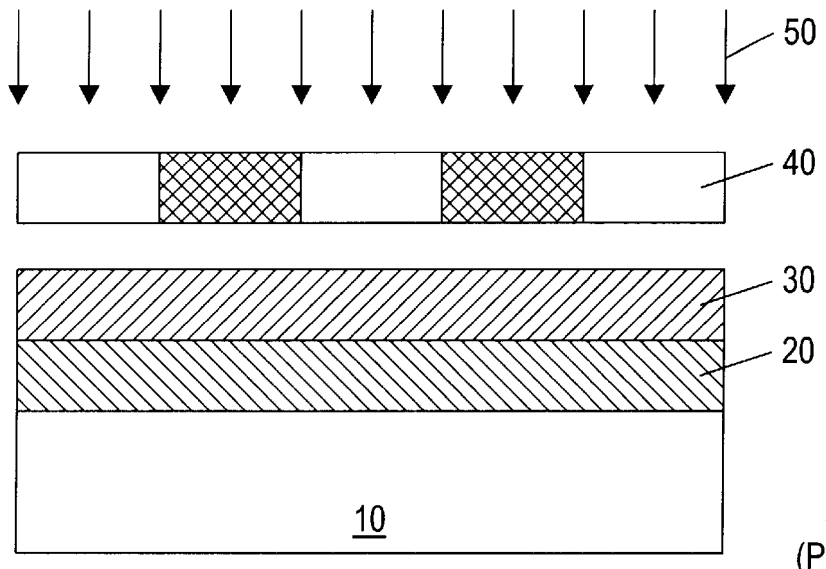
FIG. 1 is cross-sectional view of a semiconductor substrate having a layer to be patterned using photolithography.
Figure 2:
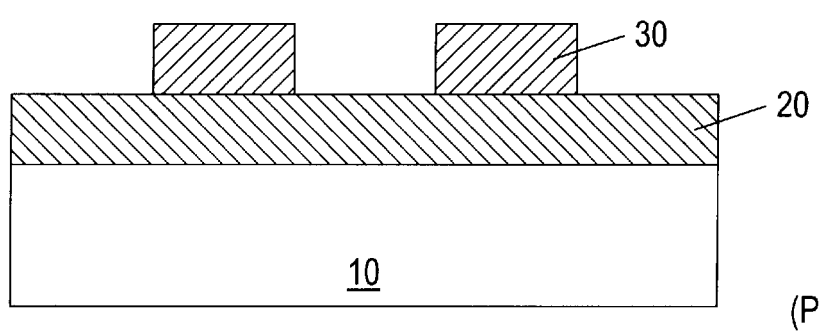
FIG. 2 is a partial cross-sectional view of the semiconductor substrate according to a processing step subsequent to FIG. 1 showing patterning of the photoresist layer with removal agent after partial exposure.
Figure 3:
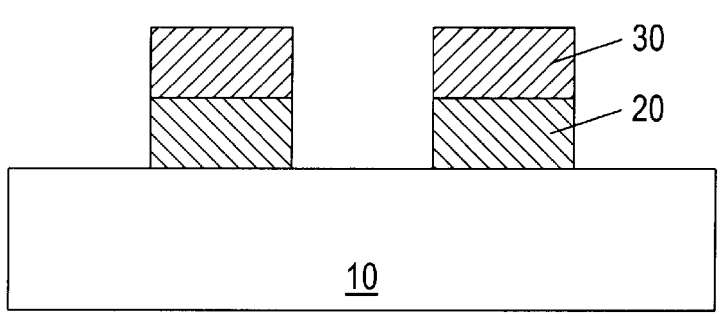
FIG. 3 is a partial cross-sectional view of the semiconductor substrate according to a processing step subsequent to FIG. 2 showing patterning of the layer below the photoresist layer with an etch process.
Figure 4:
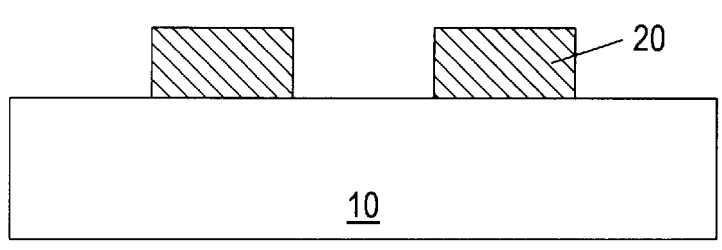
FIG. 4 is a partial cross-sectional view of the semiconductor substrate according to a processing step subsequent to FIG. 3 showing removal of the remaining photoresist layer with a polish process.
Figure 5:
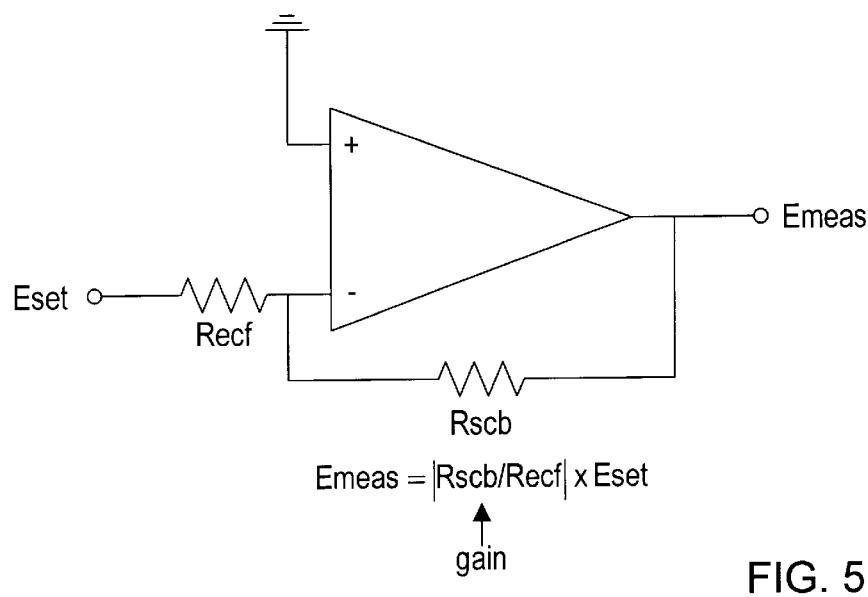
FIG. 5 shows a representation of how $R_{eef}$ and $R_{scb}$ effect $E_{meas}$ for a given value of $E_{set}$.
Figure 6:
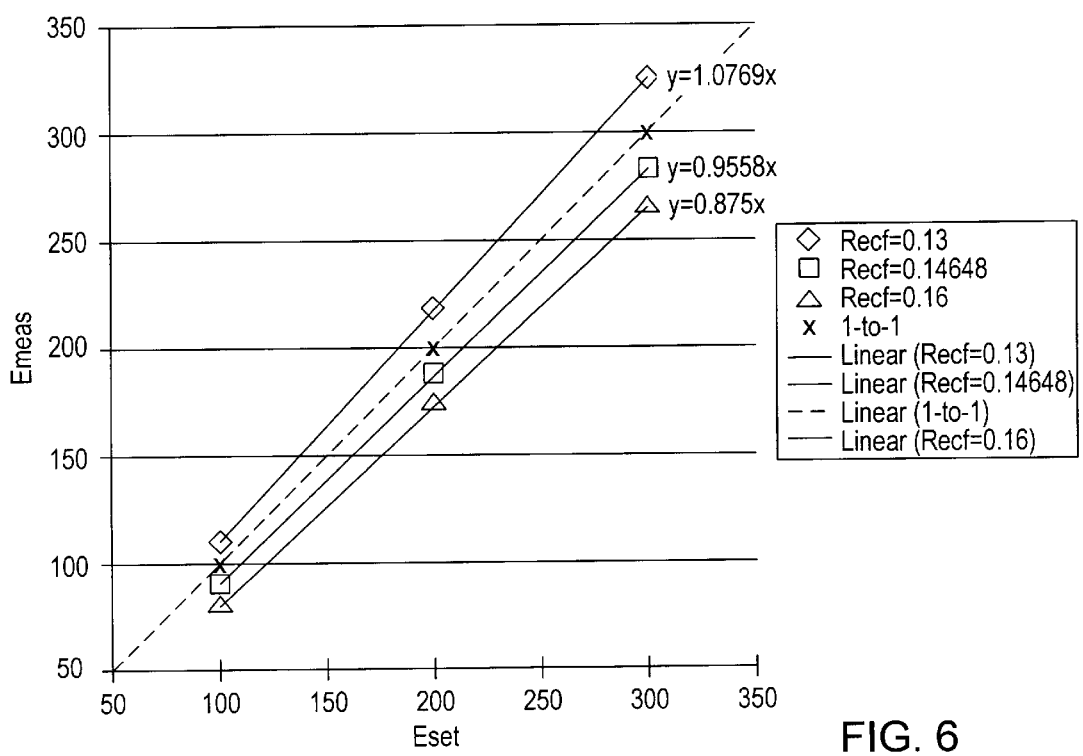
FIG. 6 shows a graph of $E_{meas}$ vs. $E_{set}$ for different settings of the Energy conversion factor $R_{eef}$.
Figure 7:
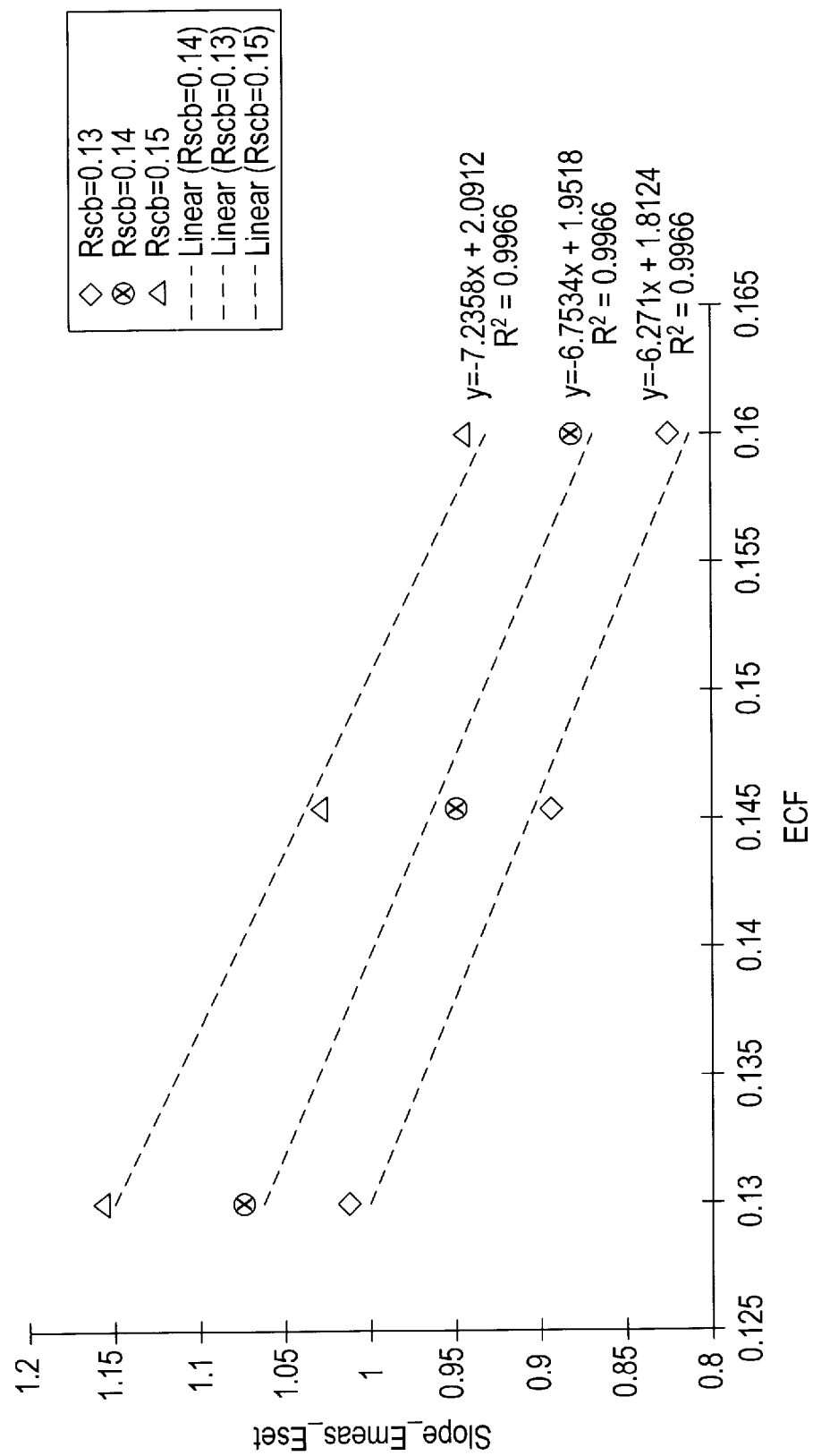
FIG. 7 shows a graph of the slope of the graph of $E_{meas}$ vs. $E_{set}$ vs. $R_{eef}$ for various resistor settings $R_{scb}$.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 8:
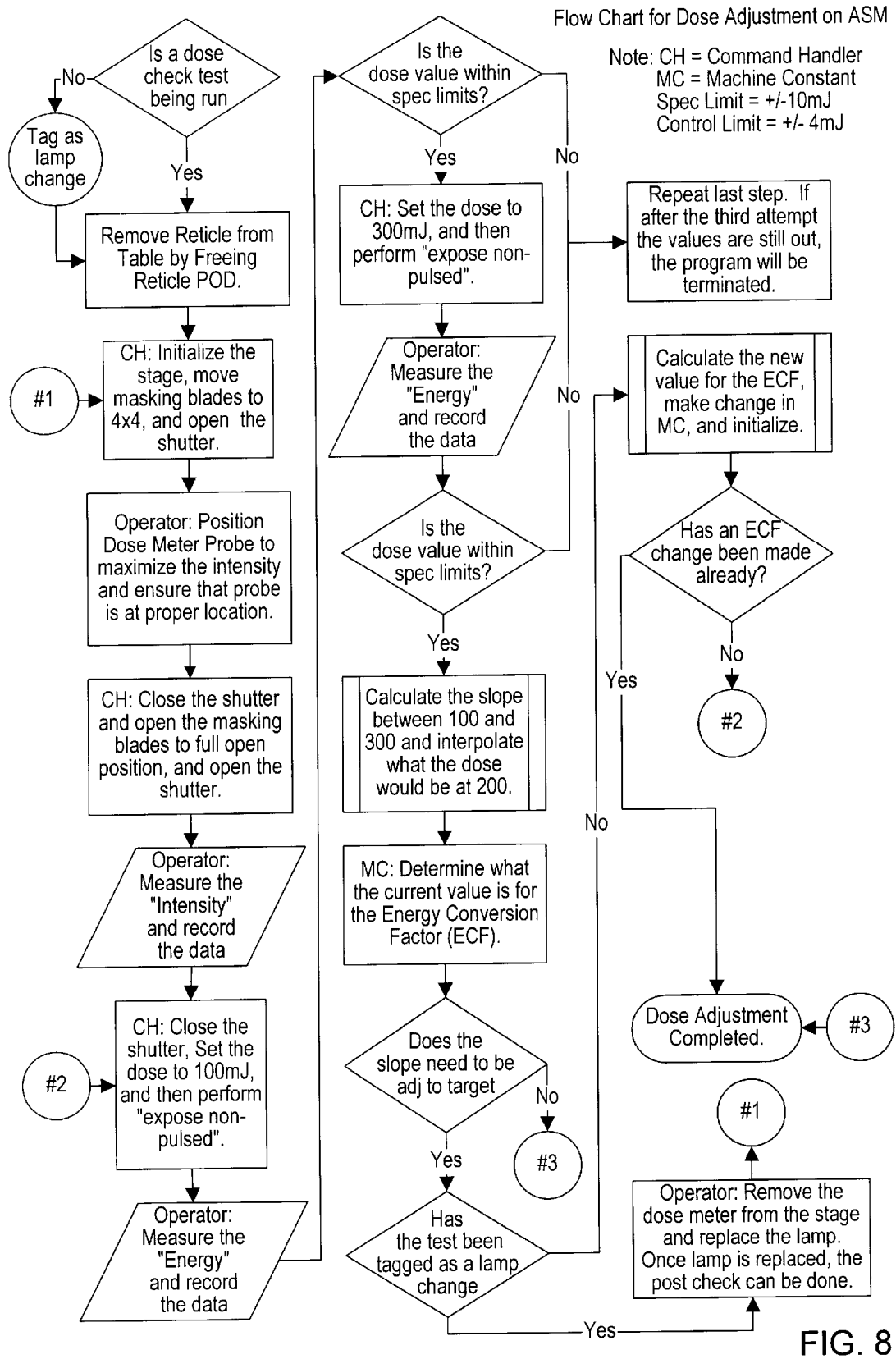
FIG. 8 shows a flowchart describing the Visual Basic program written to direct the operators and control the photoaligner through the calibration process.

Turning now to the figures, FIG. 8 shows a flowchart that describes the Visual Basic software program that was written to automate the procedures required to verify and adjust the energy dose on the ASM photoaligners. The program has the capability of manipulating the ASM photoaligner through a resident software routine on the photoaligner. In addition, the program has a user interface which prompts the operator for inputs and instructs the operator on what is required to perform the energy dose check.

At the beginning, the operator is prompted whether a lamp change or an energy dose check is being performed. The program references an Excel file for the specification limits on the input parameters to ensure that data is entered correctly. In addition, the Excel file contains target values so that the program can determine whether calibration is necessary. The results of the calibration process are written to another Excel file for archiving and further analysis. The program does not have the capability of analyzing or graphing the results at this time. However, a separate software program will be written to accomplish this.

The data which is captured by the program and written to the Excel file consists of the following (Note, the operator only needs to enter 6 of the 16 values):

record type (energy dose calibration, lamp change, etc.)
start time
end time
meter number (operator selected)
probe number (operator selected)
operator (operator selected)
intensity measurement (operator entered)
lamp hours
energy dose measurement at 100 mJ/cm$^2$ (operator entered)

energy dose measurement at 300 mJ/cm² (operator entered)

calculated energy dose at 200 mJ/cm² calculated intercept calculated slope target slope original ECF value final ECF value The Excel specification file parameters used by the program, which indicate the targets and input limits for the individual photoaligners, are:

ASM number slope target slope min slope max intensity min intensity max intercept min intercept max energy dose measurement at 100 mJ/cm² min energy dose measurement at 100 mJ/cm² max energy dose measurement at 300 mJ/cm² min energy dose measurement at 300 mJ/cm² max ECF min ECF max FIG. 9 shows the main screen at the very beginning of the software program. The input specification limits and target values for the particular photoaligner being calibrated are listed. The operator first clicks on the type of procedure to be performed (Energy Dose Check, Before Lamp Change, or After Lamp Change). At this point the operator should have the energy dose meter available for use and the photoaligner front cover opened.

FIG. 10 shows an example of what the energy dose check calibration screen may appear like. When the START button is pressed, the program will prompt the operator for their name (listed on a pull down screen) and, on a future revision, the type of energy dose meter and probe number being used. The lamp lit time and start time will be automatically logged.

After the initial data is entered, the reticle box is freed, the stage is moved to the home position, the blades are set to 4 mm×4 mm, and the shutter door is opened. The operator is then prompted to position the energy dose probe for maximum intensity exposure. Once the probe is positioned properly, the blades are initialized and the intensity can be read. The result can now be entered at the prompt provided by the software program. Next, the shutter is closed and the dose is set to 100 mJ/cm². The operator is then requested to change the meter to read the total energy (the probe was initially set to measure intensity). The procedure is then repeated for the 300 mJ/cm² case. If the inputted data exceeded specification limits or if the operator was not prepared when the step was executed, the operator is either prompted to repeat the step or may request for the step to be repeated.

The energy dose at 200 mJ/cm² is then interpolated, the slope and intercept are calculated, and the current ECF value is obtained from the Machine Constants (MCs). MCs are constants stored in the photoaligner and are values that control the operation of the photoaligner. A difference between the new procedures and the old procedures is that the new ones require energy dose measurements at two set points (100 mJ and 300 mJ) instead of just at one set point (200 mJ). One set point is enough to calibrate the photoaligner. However, performing the measurement at two such points ensures a more accurate calibration by checking the two results against each other for errors. These errors, for example, may be the result of operator negligence. The results of the interpolation are compared against the specification limits, which are available to the software program through Excel files, and corrections to the energy dose are calculated.

Depending upon whether a lamp change or an energy dose calibration is being performed, the program will either terminate or, if corrections are required, the operator will be prompted to repeat the test for verification purposes. The test will not be repeated a third time if adjustments are recommended on the second pass. If additional repetitions are required, the test will have to be restarted. Future revisions of the program will allow the results to be graphed.

If the input data is out of specification, the program will either reference a trouble shooting guide or request that the specific procedure be repeated for verification. After collecting the data from the operator, the program makes the necessary calculations and compares the results to a predefined data base which contains the specification limits for each of the individual photoaligners. If the results are out of the specification limits, the program will make the necessary adjustments to the Energy Conversion Factor. These adjustments will bring the energy dose value within the specification limits.

Besides saving time, automating these procedures ensures that all operators perform the procedures in the same way, thereby eliminating operator-to-operator variation. Furthermore, it will no longer be necessary to open the ASM electronics cabinet to adjust the shutter control board potentiometer for bringing the energy dose within the specification limits. By making the changes through software, it will be possible to keep a log of all calibration steps and changes over time.

It will be appreciated to those skilled in the art having the benefit of this disclosure that this invention is believed to be capable of better controlling the calibration of a photoaligner through a software program. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A computer storage medium configured with computer instructions for controlling a photoaligner, said instructions comprising:

setting said photoaligner at a first set operating state by invoking a resident software routine of said photoaligner;

prompting an operator to perform a task and enter a first externally observed value, wherein said first externally observed value reflects a first observed operating state of said photoaligner;

setting said photoaligner at a second set operating state by invoking said resident software routine of said photoaligner;

prompting an operator to perform said task and enter a second externally observed value, wherein said second externally observed value reflects a second observed operating state of said photoaligner;

computing a desired setting for a control parameter of said photoaligner by determining the slope of a plot of said externally observed values versus said set operating states; and adjusting said control parameter of said photoaligner to said desired setting in order to compensate for a difference between said set operating states and said observed operating states of said photoaligner.

2. The computer storage medium of claim 1, wherein said setting said photoaligner at a first set operating state comprises setting said photoaligner to operate at a first energy dose value, and wherein said setting said photoaligner at a second set operating state comprises setting said photoaligner to operate at a second energy dose value.

3. The computer storage medium of claim 1, wherein said first externally observed value comprises a first measured energy dose, and wherein said second externally observed value comprises a second measured energy dose.

4. The computer storage medium of claim 1, wherein said prompting an operator to perform a task comprises:

placing an energy dose meter into said photoaligner such that said energy dose meter is exposed to a radiation of said photoaligner;

measuring an energy dose of said photoaligner with said energy dose meter; and entering said energy dose into said computer storage medium.

5. The computer storage medium of claim 4, wherein said energy dose is a product of an intensity of said radiation and an exposure time.

6. The computer storage medium of claim 1, further comprising logging said first set operating state, said second set operating state, said first externally observed value, said second externally observed value, and said control parameter.

7. The computer storage medium of claim 1, wherein said control parameter comprises a photoaligner machine constant.

8. A method for controlling a photoaligner comprising:

setting said photoaligner at a first set operating state by invoking a resident software routine of said photoaligner;

prompting an operator to perform a task and enter a first externally observed value, wherein said first externally observed value reflects a first observed operating state of said photoaligner;

setting said photoaligner at a second set operating state by invoking said resident software routine of said photoaligner;

prompting an operator to perform said task and enter a second externally observed value, wherein said second externally observed value reflects a second observed operating state of said photoaligner;

computing a desired setting for a control parameter of said photoaligner by determining the slope of a plot of said externally observed values versus said set operating states; and adjusting said control parameter of said photoaligner to said desired setting in order to compensate for a difference between said set operating states and said observed operating states of said photoaligner.

9. The method of claim 8, wherein said setting said photoaligner at a first set operating state comprises setting said photoaligner to operate at a first given energy dose value, and wherein said setting said photoaligner at a second set operating state comprises setting said photoaligner to operate at a second given energy dose value.

10. The method of claim 8, wherein said first externally observed value comprises a first measured energy dose, and wherein said second externally observed value comprises a second measured energy dose.

11. The method of claim 8, wherein said prompting an operator to perform a task comprises:

placing an energy dose meter into said photoaligner such that said energy dose meter is exposed to a radiation of said photoaligner;

measuring an energy dose of said photoaligner with said energy dose meter; and recording said energy dose.

12. The method of claim 11, wherein said energy dose is a product of an intensity of said radiation and an exposure time.

13. The computer storage medium of claim 8, further comprising logging said first set operating state, said second set operating state, said first externally observed value, said second externally observed value, and said control parameter.

14. The computer storage medium of claim 8, wherein said control parameter comprises a photoaligner machine constant.

* * * * *